US008706445B2

(12) United States Patent
Asami (10) Patent No.: US 8,706,445 B2
(45) Date of Patent: Apr. 22, 2014

(54) MEASUREMENT APPARATUS, PROGRAM, RECORDING MEDIUM, AND MEASUREMENT METHOD

(75) Inventor: Koji Asami, Saitama (JP)

(73) Assignee: Advantest Corporation, Tokyo (JP)

( * ) Notice: Subject to any disclaimer, the term of this patent is extended or adjusted under 35 U.S.C. 154(b) by 784 days.

(21) Appl. No.: 12/507,320

(22) Filed: Jul. 22, 2009

(65) Prior Publication Data

US 2011/0022341 A1    Jan. 27, 2011

(51) Int. Cl.
*G06F 17/18* (2006.01)
*H03M 1/12* (2006.01)

(52) U.S. Cl.
USPC ............................. 702/180; 341/120; 341/155

(58) Field of Classification Search
USPC ............................. 702/75, 180; 341/155, 120
See application file for complete search history.

(56) References Cited

U.S. PATENT DOCUMENTS

| 5,793,642 A * | 8/1998 | Frisch et al. .................... 703/4 |
| 6,512,472 B1 * | 1/2003 | Smith et al. .................... 341/155 |
| 2006/0256892 A1 * | 11/2006 | Momtaz ........................ 375/317 |

FOREIGN PATENT DOCUMENTS

| JP | 8-149005 A | 6/1996 |
| JP | 8-223039 A | 8/1996 |
| JP | 10-79667 A | 3/1998 |
| JP | 11-177424 A | 7/1999 |

OTHER PUBLICATIONS

Hsin-Wen Ting et al., "A Histogram-Based Testing Method for Estimating A/D Converter Performance", IEEE Transactions on Instrumentation and Measurement, vol. 57, No. 2, Feb. 2008, p. 420-427.*
Jerome Blair, "Histogram Measurement of ADC Nonlinearities Using Sine Waves", IEEE Transactions on Instrumentation and Measurement, vol. 43, No. 3, Jun. 1994, p. 373-383.*
IEEE Standard for Terminology and Test Methods for Analog-To-Digital Converters, IEEE Std 1241-2000, 91 pp., http://ieeexplore.ieee.org/stamp/stamp.jsp?tp=&arnumber=929859.*
Peetz et al., "Measuring Waveform Recorder Performance", Hewlett-Packard Journal, Nov. 1982, pp. 21-29 (in English). Mentioned on p. 1 of the specification.
Doernberg et al., "Full-Speed Testing of A/D Converters", IEEE Journal of Solid-State Circuits, 1984, vol. SC-19, No. 6, pp. 820-827 (in English). Mentioned on p. 1 of the specification.

* cited by examiner

*Primary Examiner* — Michael Nghiem
*Assistant Examiner* — Alexander Satanovsky (57) ABSTRACT

Provided is a measurement apparatus that measures a characteristic of an AD converter, comprising a signal supplying section that supplies the AD converter with an analog input signal having a prescribed waveform; an acquiring section that acquires a digital output signal output by the AD converter as a result of sampling the analog input signal; a measured histogram generating section that generates a histogram of the digital output signal; and a range calculating section that calculates at least one of an analog value corresponding to a lower limit and an analog value corresponding to an upper limit of a prescribed digital range, based on at least one of (i) a frequency corresponding to digital values, in a measured histogram obtained by measuring the digital output signal, that are less than or equal to the digital range and (ii) a frequency corresponding to digital values in the measured histogram that are greater than or equal to the digital range.

20 Claims, 7 Drawing Sheets

MEASUREMENT APPARATUS, PROGRAM, RECORDING MEDIUM, AND MEASUREMENT METHOD

BACKGROUND

1. Technical Field

The present invention relates to a measurement apparatus, a program, a recording medium, and a measurement method.

2. Related Art

A sine wave histogram technique is known for evaluating characteristics of an AD converter 10 (analog/digital converter).

Patent Document 1: Japanese Patent Application Publication No. 8-149005
Patent Document 2: Japanese Patent Application Publication No. 8-223039
Patent Document 3: Japanese Patent Application Publication No. 11-177424
Patent Document 4: Japanese Patent Application Publication No. 10-79667
Non-Patent Document 1: Bruce E. Peetz, Arthur S. Muto, J. Martin Neil, "Measuring Waveform Recorder Performance", HEWLETT-PACKARD JOURNAL, November 1982, pp. 21-29
Non-Patent Document 2: Joey Doernberg, Hae-Seung Lee, David A. Hodges, "Full-Speed Testing of A/D Converters", IEEE Journal of Solid-State Circuits, 1984, Vol. SC-19, No. 6, pp. 820-827

With the sine wave histogram technique, a comparison is made between an ideal histogram and a measured histogram that is obtained by measuring the output of the AD converter when a sine wave is input thereto. However, since the range error and offset error of the AD converter serving as the device under test is unknown, a relatively heavy burden is created by preparing an amplitude of the input sine wave, calculating the offset voltage, and calculating the ideal histogram.

SUMMARY

Therefore, it is an object of an aspect of the innovations herein to provide a measurement apparatus, a program, a recording medium, and a measurement method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary measurement apparatus may include a measurement apparatus that measures a characteristic of an AD converter, comprising a signal supplying section that supplies the AD converter with an analog input signal having a prescribed waveform; an acquiring section that acquires a digital output signal output by the AD converter as a result of sampling the analog input signal; a measured histogram generating section that generates a histogram of the digital output signal; and a range calculating section that calculates at least one of an analog value corresponding to a lower limit and an analog value corresponding to an upper limit of a prescribed digital range, based on at least one of (i) a frequency corresponding to digital values, in a measured histogram obtained by measuring the digital output signal, that are less than or equal to the digital range and (ii) a frequency corresponding to digital values in the measured histogram that are greater than or equal to the digital range.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
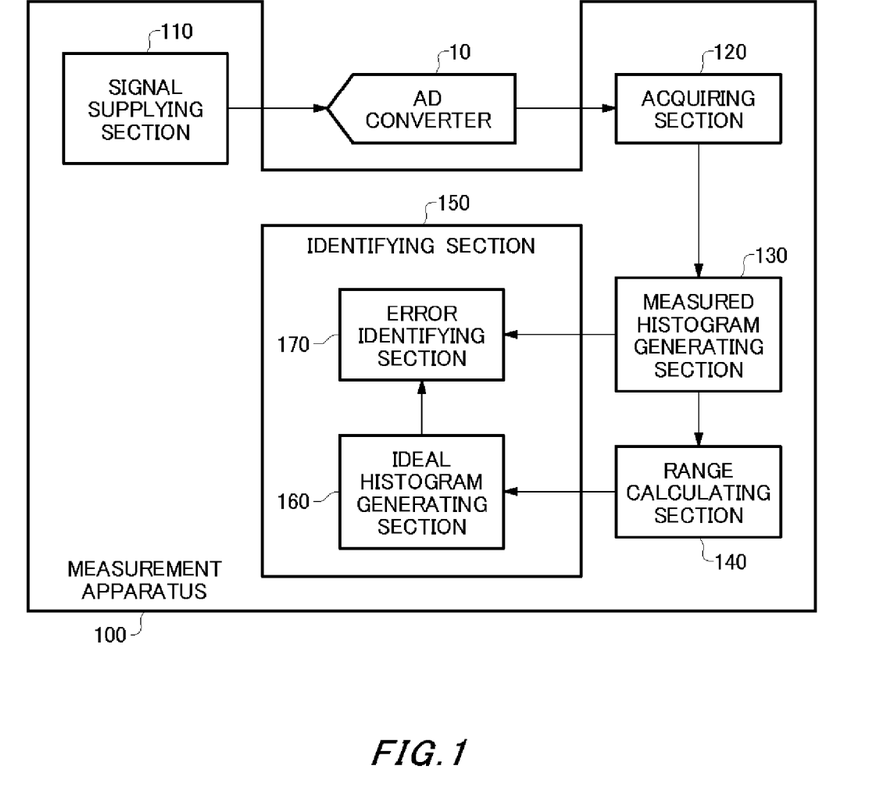
FIG. 1 shows an exemplary configuration of a measurement apparatus 100 according to an embodiment of the present invention, along with an AD converter 10.

FIG. 1 shows an exemplary configuration of a measurement apparatus 100 according to an embodiment of the present invention, along with an AD converter 10. The measurement apparatus 100 tests the AD converter 10, which is the device under test. The device under test may instead be a LSI, system on chip (SOC), or the like containing an AD converter. The measurement apparatus 100 inputs an analog input signal into the AD converter 10 to test the AD converter 10, and compares a measured histogram based on an output signal from the AD converter 10 to an ideal histogram in order to test the linearity of the AD converter 10.

The measurement apparatus 100 inputs a signal that exceeds the full-scale input of the AD converter 10 to generate an ideal histogram that reflects the gain and DC offset from the measured histogram, and evaluates the linearity of the AD converter 10 by comparing the measured histogram to this ideal histogram. The measurement apparatus 100 is provided with a signal supplying section 110, an acquiring section 120, a measured histogram generating section 130, a range calculating section 140, and an identifying section 150.

The signal supplying section 110 supplies the AD converter 10 with an analog input signal having a prescribed waveform. The analog input signal may be a sine wave signal, a ramp waveform that changes linearly from an initial potential to a designated potential, or any of a variety of predetermined types of waveforms. In the following description of the embodiment, the analog input signal is a sine wave.

The acquiring section 120 acquires a digital output signal output by the AD converter 10 as a result of sampling the analog input signal. The digital output signal acquired by the acquiring section 120 may be a BCD signal or a binary code quantized with the resolution of the AD converter 10. The acquiring section 120 may acquire the output signal in synchronization with the clock frequency of the AD converter 10, or may include a digital circuit that performs flow control and buffering such as FIFO (First-In First-Out).

The measured histogram generating section 130 generates a histogram of the digital output signal. For example, the measured histogram generating section 130 may increment a counter corresponding to sequentially acquired values of the digital output signal, and generate the histogram by totaling the occurrence frequency of each value of the digital output signal. When the analog input signal is a sine wave, the measured histogram generating section 130 generates a histogram that follows a catenary line. When the analog input signal is a sine wave having an amplitude value greater than or equal to the full scale of the AD converter 10, the measured histogram generating section 130 generates a histogram that follows a catenary line within a digital range corresponding to the full scale of the AD converter 10.

The range calculating section 140 calculates at least one analog value that corresponds to an upper limit or to a lower limit of the digital range, based on at least one of (i) the occurrence frequency of digital values corresponding to a portion less than or equal to the prescribed digital range in the measured histogram obtained by measuring the digital output signal and (ii) the occurrence frequency of digital values corresponding to a portion greater than or equal to the prescribed digital range in the measured histogram. The range calculating section 140 calculates the analog signal from the measured histogram with reference to the gain of the AD converter 10 and the DC offset of the analog input signal.

The identifying section 150 identifies an error of the AD converter 10 based on the measured histogram and the at least one analog value corresponding to the lower limit or the upper limit of the digital range calculated by the range calculating section 140. The identifying section 150 identifies a distribution range over which the measured histogram and the ideal histogram are to be compared, based on the analog value calculated by the range calculating section 140, and compares these two histograms over the identified range. The identifying section 150 identifies the error of the AD converter 10 by comparing the measured histogram and the ideal histogram. The identifying section 150 includes an ideal histogram generating section 160 and an error identifying section 170.

The ideal histogram generating section 160 generates the ideal histogram obtained when sampling an analog input signal having the prescribed waveform, based on the at least one analog value corresponding to the lower limit or the upper limit of the digital range calculated by the range calculating section 140. The ideal histogram generating section 160 generates the ideal histogram to ideally match the measured histogram of digital values using a theoretical distribution function of analog values.

The error identifying section 170 identifies the error of the AD converter 10 based on the measured histogram and the ideal histogram. The error identifying section 170 identifies the error of the AD converter 10 by comparing the ideal histogram and the measured histogram based on the analog values calculated by the range calculating section 140.

Figure 2:
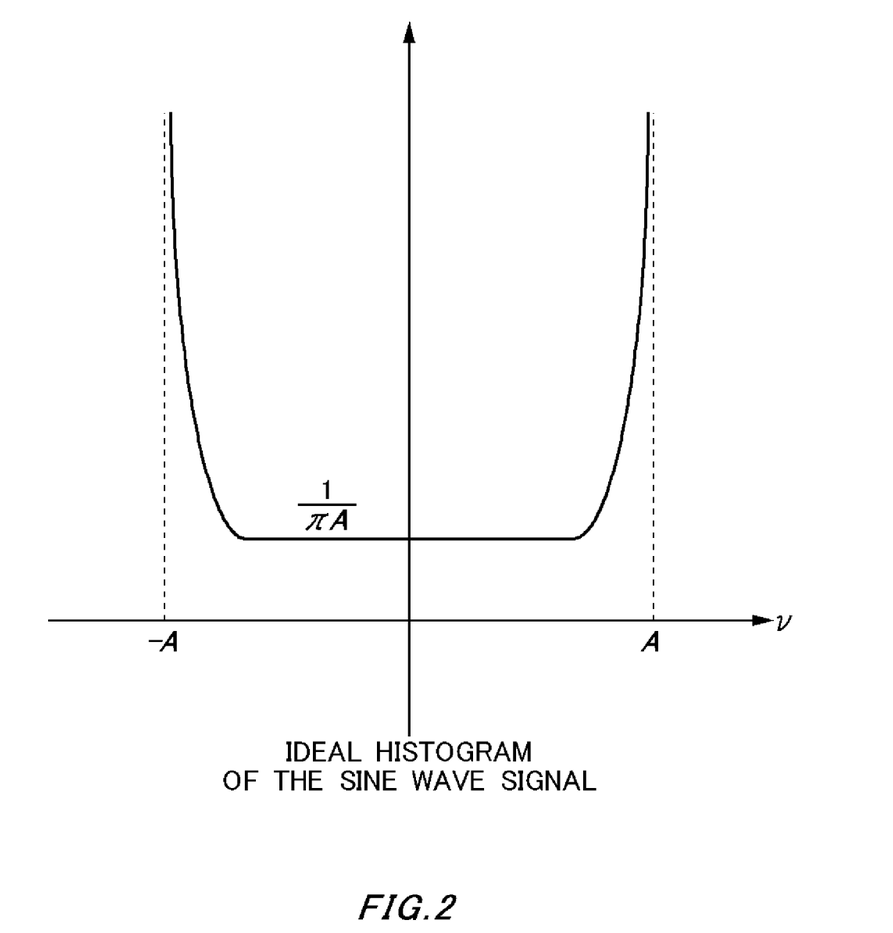
FIG. 2 shows an ideal histogram of a sine wave signal.

FIG. 2 shows an ideal histogram of a sine wave signal. In the ideal histogram of the sine wave signal, the ends of the theoretical probability density function become infinitely large, and the frequency at both ends of the actual measured histogram of the AD converter 10 also becomes large. The theoretical probability density function can be expressed by Expression 1, with v as a variable.

$$p(v) = \frac{1}{\pi\sqrt{A^2 - v^2}}$$ Expression 1

Here, the symbol "A" used in Expression 1 represents the amplitude of the sine wave. As shown in FIG. 2, the probability density function of the sine wave is distributed over the range from −A to A. Expression 1 is normalized such that integrating from −A to A results in a value of 1. If the distribution range −A to A precisely matches the full scale of the AD converter 10, the probability density function of the sine wave ideally matches the measured histogram generated by the measured histogram generating section 130.

However, it is difficult to precisely match the amplitude of the sine wave to the full scale of the AD converter 10. Furthermore, due to the DC offset, gain error, and the like caused by analog components, the signal supplying section 110 cannot easily supply the AD converter 10 with the appropriate sine wave signal. Therefore, the signal supplying section 110 supplies the AD converter 10 with a sine wave signal having an amplitude greater than the full scale of the AD converter 10.

Figure 3:
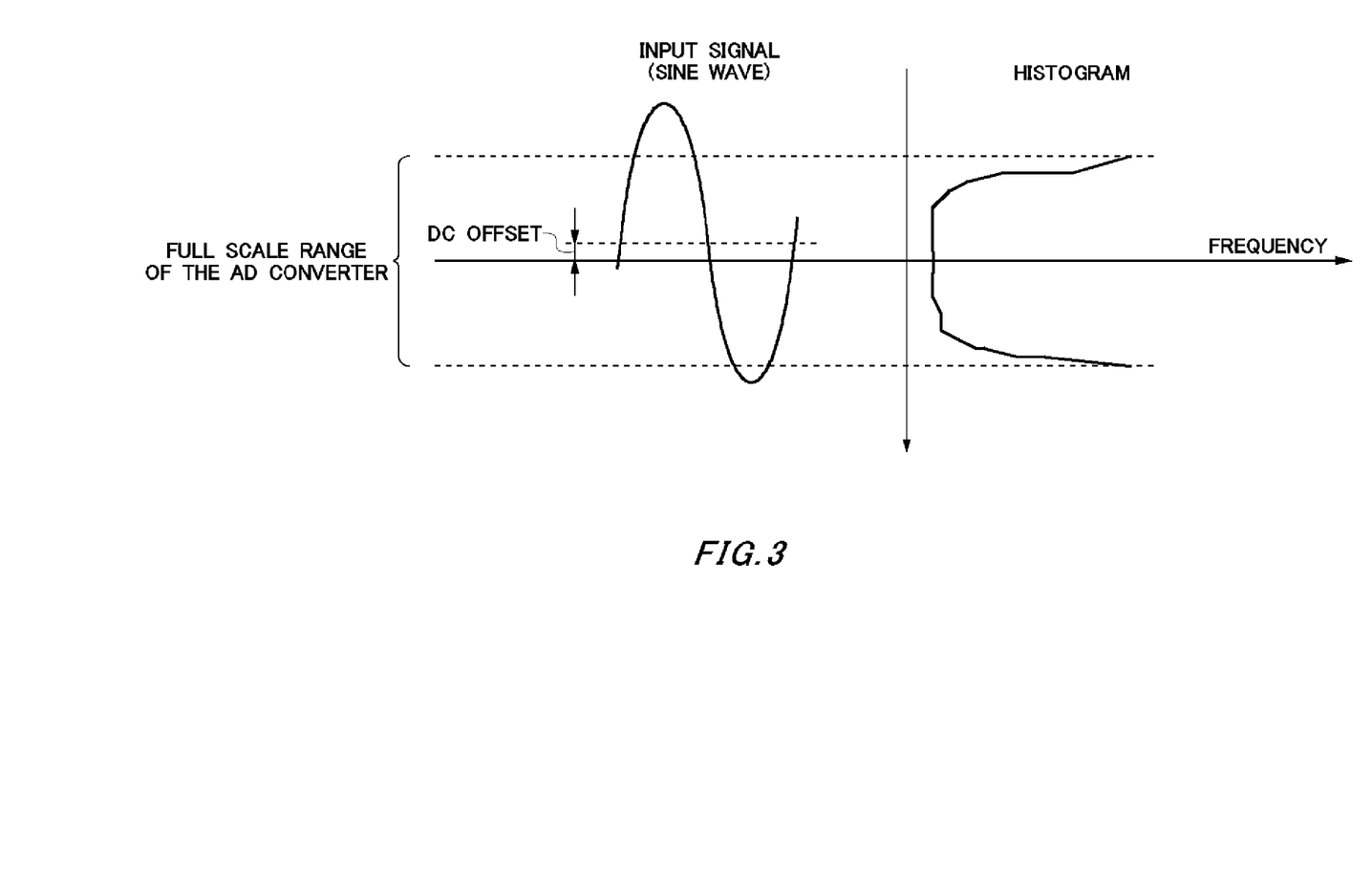
FIG. 3 schematically shows a measured histogram of the AD converter 10 according to the present embodiment.

FIG. 3 schematically shows a measured histogram of the AD converter 10 according to the present embodiment. The input signal supplied to the AD converter 10 in FIG. 3 is a sine wave signal with an amplitude greater than the full scale of the AD converter 10. Therefore, the AD converter 10 has an overflow at the ends of the amplitude of the sine wave signal, and the measured histogram generating section 130 generates the measured histogram such that the occurrences in these portions are superimposed on the bins of the histogram at the upper and lower limits. Accordingly, if the upper and lower limits of the measured histogram are ignored, a portion of the sine wave probability density ideally matches the measured histogram. The measurement apparatus 100 may therefore determine the non-linearity of the AD converter 10 to be the error between the measured histogram and the ideal histogram.

The range calculating section 140 determines which part of the sine wave probability density matches the measured histogram. As shown in FIG. 3, the input signal supplied by the signal supplying section 110 includes a DC offset voltage. Furthermore, the AD converter 10 superimposes the DC offset voltage onto the digital output. The AD converter 10 might also apply gain to the digital signal. In the present embodiment, the range calculating section 140 calculates that analog values of the sine wave probability density corresponding to the upper and lower limit values of the measured histogram that reflects the DC offset and gain. The identifying section 150 generates the ideal histogram based on the analog values of the sine wave probability density, and identifies the error of the AD converter 10 by comparing the ideal histogram to the measured histogram.

Figure 4:
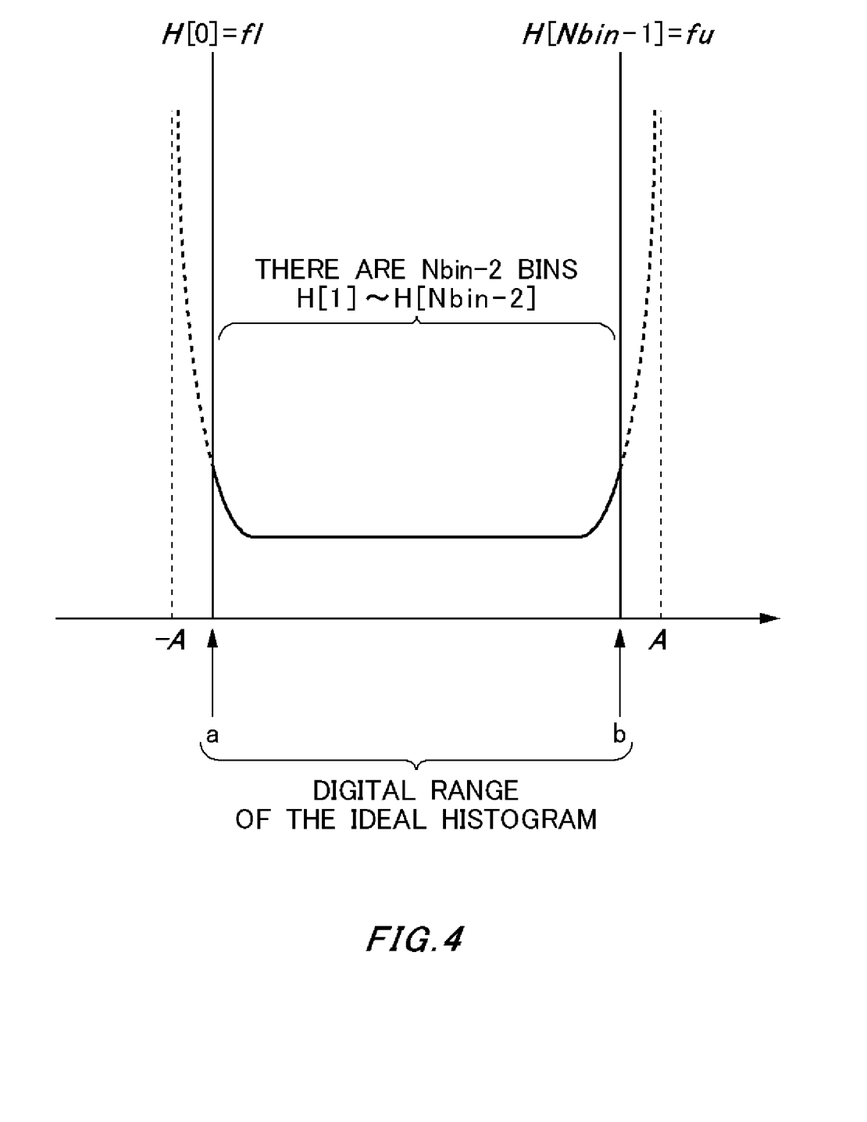
FIG. 4 schematically shows an ideal histogram of an ideal AD converter 10 according to the present embodiment.

FIG. 4 schematically shows an ideal histogram of an ideal AD converter 10 according to the present embodiment. The signal supplying section 110 supplies the AD converter 10 with a sine wave signal having an amplitude A that is greater than the full scale of the AD converter 10. The range calculating section 140 and the ideal histogram generating section 160 set he full scale range of the AD converter 10 to be from "a" to b.

Based on FL and FU, which are the frequencies at the lower and upper limits of the measured histogram of the AD converter 10, the range calculating section 140 calculates where the measured histogram is positioned in the sine wave probability density relative to the values of FL and FU. First, since the sine wave probability density is normalized, the range calculating section 140 normalizes FL and FU using the total number of data points in the measured histogram. With the total number of data points in the measured histogram represented as Npts, the range calculating section 140 calculates normalized bin values fl and fu at each end using the following Expression.

$$fl = \frac{FL}{Npts} = H[0] \qquad \text{Expression 2}$$

$$fu = \frac{FU}{Npts} = H[Nbin-1] \qquad \text{Expression 3}$$

Here, fl is a value onto which is superimposed the occurrence frequency in a range from −A to "a," and therefore fl is equal to a value obtained by integrating the sine wave probability density expression from −A to "a." Therefore, the following expressions can be obtained by integrating Expression 1 from −A to "a." Here, in order to simplify the calculation, A is set equal to 1.

$$fl = \int_{-1}^{a} \frac{1}{\pi\sqrt{1-v^2}} dv = \frac{1}{2} + \frac{1}{\pi}\sin^{-1}(a) \qquad \text{Expression 4}$$

$$a = \sin\{\pi(fl - 1/2)\} \qquad \text{Expression 5}$$

In the same way, fu is a value onto which is superimposed the occurrence frequency in a range from b to −A, and therefore fu is equal to a value obtained by integrating the ideal sine wave expression from b to A. Therefore, the following expressions can be obtained by integrating Expression 1 from −A to "a."

$$fu = \int_{b}^{1} \frac{1}{\pi\sqrt{1-v^2}} dv = \frac{1}{2} - \frac{1}{\pi}\sin^{-1}(b) \qquad \text{Expression 6}$$

$$b = \sin\{\pi(1/2 - fu)\} \qquad \text{Expression 7}$$

Accordingly, by using Expressions 5 and 7, the range calculating section 140 can calculate the analog values "a" and b of the sine wave probability density corresponding to the upper and lower limit values of the measured histogram. In other words, the positions of the ends of the ideal histogram are calculated, and the ideal histogram generating section 160 can generate the ideal histogram using the analog values "a" and b.

The ideal histogram generating section 160 supplies the ideal histogram to the error identifying section 170. Here, the number of bins quantized by the AD converter 10 is represented as Nbin and the ideal histogram of the n-th bin is represented as H[n]. When the number of number of bits of the AD converter 10 is N, Nbin is equal to $2^N$. The ideal histogram generating section 160 may generate the histogram shown by the solid line in FIG. 4, for example.

Figure 5:
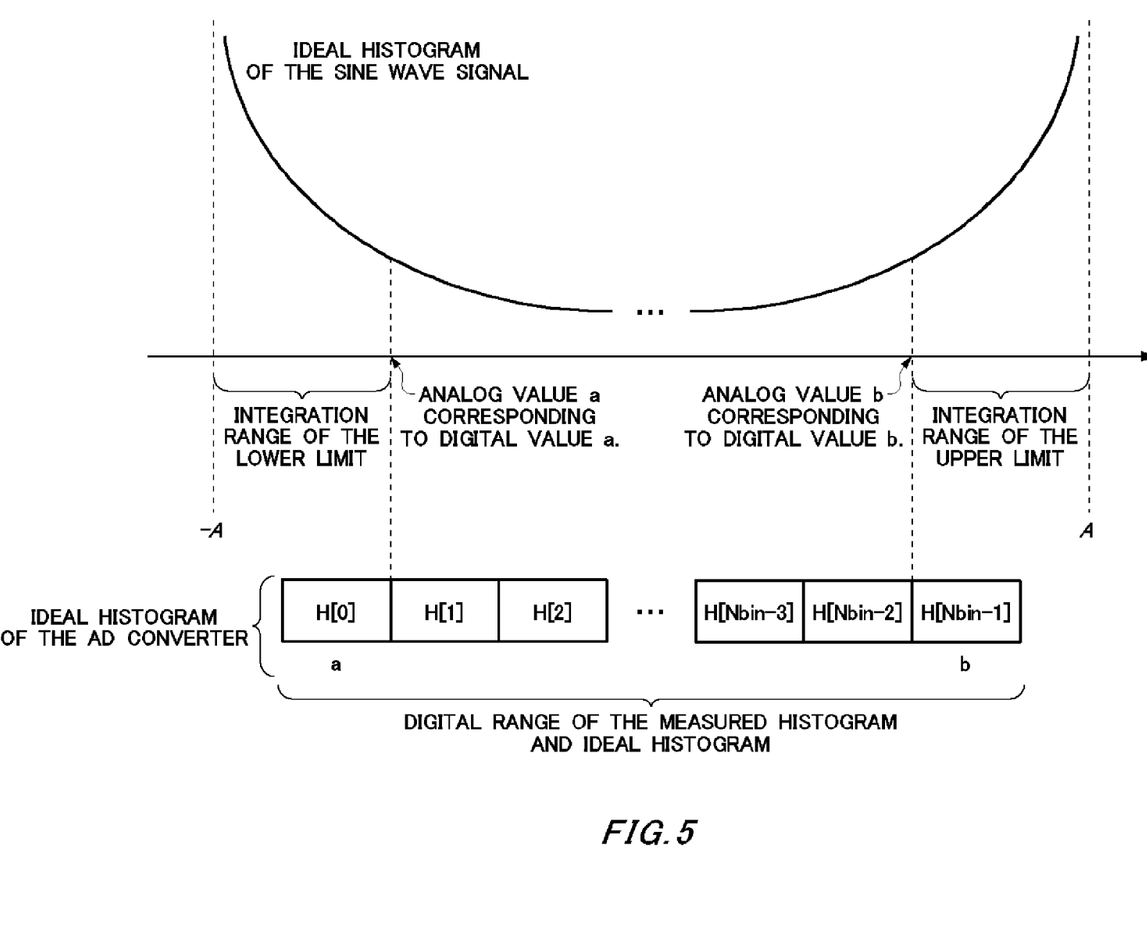
FIG. 5 shows a comparison between the digital values and analog values of the present embodiment.

FIG. 5 shows a comparison between the digital values and analog values of the present embodiment. The ideal histogram is the same as in FIG. 4, and shows the comparison made over an analog range of the sine wave histogram corresponding to the horizontal axis. It bears repeating that the range calculating section 140 calculates the position "a" at which the lower limit value H[0] of the digital range becomes equal to the value obtained by integrating the sine wave histogram from −A to "a," and sets this position to have an analog value "a" corresponding to the digital value "a." In the same way, the range calculating section 140 calculates an analog value b corresponding to a digital value b.

The ideal histogram generating section 160 generates the ideal histogram from the analog value "a" to the analog value b. The ideal histogram generating section 160 divides an analog section [a,b] into a number of bins Nbin corresponding to the number of bits N of the AD converter 10. In other words, the ideal histogram generating section 160 divides the section [a, b] into (Nbin−2) bins, with each bin having a width ΔBin.

$$\Delta\text{Bin} = \frac{b-a}{Nbin-2} \qquad \text{Expression 8}$$

The ideal histogram generating section 160 generates the ideal histogram H[n] of the section [a, b] based on the sine wave probability density. Here, the bin values fl and fu at each end are known, and so the ideal histogram generating section 160 generates H[n] for bins other than H[0]=fl and H[Nbin−1]=fu. The ideal histogram generating section 160 can divide the section [a, b] using Expression 8, and can therefore calculate the occurrence frequency in each section by integrating the sine wave probability density for each section as shown in Expression 9.

$$H[n] = \int_{n-\Delta Bin/2}^{n+\Delta Bin/2} \frac{1}{\pi\sqrt{1-v^2}} dv \approx p(n)\cdot\Delta\text{Bin} \qquad \text{Expression 9}$$

Figure 6:
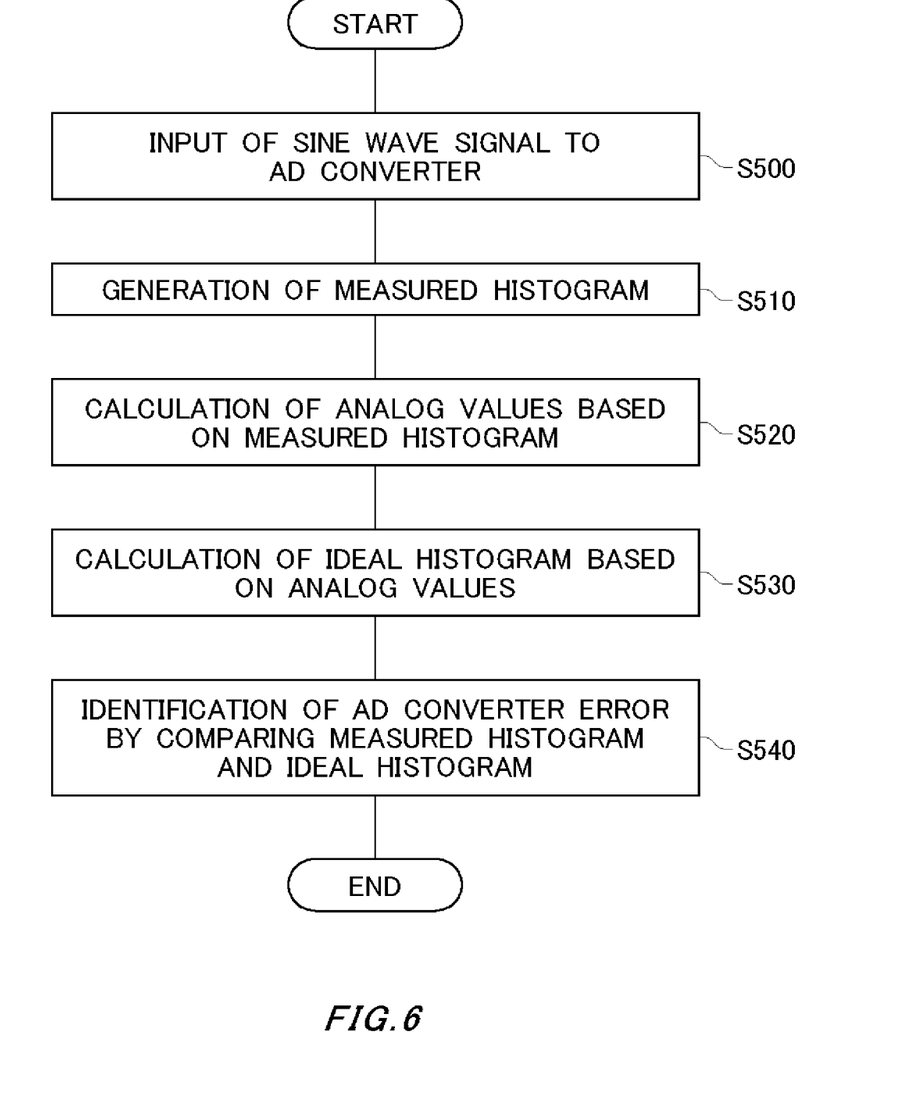
FIG. 6 shows a performance flow of the measurement apparatus 100 according to the present embodiment.

FIG. 6 shows a performance flow of the measurement apparatus 100 according to the present embodiment. The measurement apparatus 100 uses the signal supplying apparatus 110 to supply the sine wave signal to the AD converter 10 (S500). Here, the signal supplying section 110 supplies a sine wave with an amplitude exceeding the full scale of the AD converter 10. The AD converter 10 converts the sine wave signal supplied from the signal supplying section 110 into a digital signal with a suitable clock. Here, the AD converter 10 may be supplied with the clock signal by the measurement apparatus 100, or may be supplied with the clock signal from outside of the measurement apparatus 100.

The acquiring section 120 acquires a digital signal converted by the AD converter 10. The measured histogram generating section 130 generates the measured histogram based on the digital signal acquired by the acquiring section 120 (S510). The measured histogram generating section 130 generates the measured histogram to have a frequency distribution in a digital range corresponding to the full scale of the AD converter 10. For example, an N-bit AD converter 10 has a digital range of $2^N$.

The range calculating section 140 calculates, based on the measured histogram in the digital range generated by the measured histogram generating section 130, analog values of the ideal histogram of the sine wave signal corresponding to the upper and lower limit values of the digital range (S520). Using the upper and lower limit values of the digital range, which is the horizontal axis of the histogram, the measured histogram generating section 130 generates a result obtained by adding together all of the frequencies of the input signal exceeding the full scale.

The total sum of the frequencies in the digital range exceeding the full scale matches the integrated value of the occurrence frequency in the corresponding analog range, and so the range calculating section 140 can use Expressions 5 and 7 to calculate the analog values corresponding to the upper and lower limit values of the measured histogram. The range calculating section 140 supplies the calculated analog values to the ideal histogram generating section 160.

The ideal histogram generating section 160 generates an ideal histogram to be obtained by the AD converter 10 based on the received analog histogram (S530). The ideal histogram generating section 160 divides the range of the analog values corresponding to the upper and lower limit values of the measured histogram of the ideal histogram of the sine wave signal into a number of units according to the resolution of the AD converter 10.

For example, for an N-bit AD converter 10, the ideal histogram generating section 160 divides this range into $2^N$ units. The ideal histogram generating section 160 generates the ideal histogram of the AD converter 10 by integrating the frequency for the divided range. Here, the ideal histogram generating section 160 may use the values obtained at S520 for the upper and lower limit values. In this case, the ideal histogram generating section 160 calculates the remaining occurrence frequencies using Expression 9.

The error identifying section 170 identifies the error of the AD converter by comparing the measured histogram to the ideal histogram generated by the ideal histogram generating section 160 (S540). Since the digital range of the measured histogram matches the digital range of the ideal histogram generated by the ideal histogram generating section 160, the error identifying section 170 may judge the AD converter 10 to be non-linear if a difference is found when comparing occurrence frequencies at each digital position.

The measurement apparatus 100 of the present embodiment can evaluate characteristics of the AD converter 10 using a sine wave histogram, without measuring and/or calculating the DC offset and amplitude of the sine wave signal supplied to the signal supplying section 110 or the DC offset and gain of the AD converter 10. Accordingly, the measurement apparatus 100 can evaluate the AD converter 10 with a high throughput.

In the above description, the signal supplying section 110 supplies a sine wave signal with an amplitude that exceeds the full scale of the AD converter 10. Instead, the signal supplying section 110 may supply a sine wave signal having a DC offset and an amplitude that goes beyond either the upper limit or the lower limit of the full scale of the AD converter 10. The range calculating section 140 can calculate the analog values of the ideal histogram for the upper and lower limits exceeding the full scale using the method described above.

As an example, the following described a case in which the signal supplying section 110 supplies a sine wave signal that goes beyond the lower limit of the full scale of the AD converter 10. Since the sine wave signal goes beyond the lower limit, the range calculating section 140 calculates the analog value "a" shown in FIG. 5 using Expression 5. However, since the upper limit of the sine wave signal does not exceed the full scale, the measured histogram generating section 130 generates a histogram in which the upper limit value of the digital range converted by the AD converter 10 corresponds to A in FIG. 5.

The range calculating section 140 calculates an analog range [a, b] corresponding to the digital range a to b in which the ideal histogram is generated. In this case, the digital value b may be within the digital range at a position designated by a user for observation, or may instead be a value designated by the measurement apparatus 100. For example, the measurement apparatus 100 may designate the digital value b to be a value, from among a plurality of pre-registered values, that is the minimum or maximum value within the digital range. Instead, the measurement apparatus 100 may multiply a pre-registered value no greater than 1 by the digital range and, with this range as the observed range, convert the digital value b and designate the converted value.

The range calculating section 140 calculates the analog value b based on a value at which (i) the total sum of the occurrence frequencies from the designated digital value b to the upper limit of the digital range matches (ii) the integrated value from the corresponding analog value b to A. In other words, the range calculating section 140 may calculate the corresponding analog value using Expression 7, with the total sum from the digital value b to the upper limit of the digital range as fu.

Here, the further the digital value gets from the upper limit of the digital range, the greater the total sum of the occurrence frequency in the digital range becomes, enabling the range calculating section 140 to accurately calculate the analog value. Furthermore, as long as the upper limit of the input sine wave signal differs from the upper limit of the full scale of the AD converter 10, the measured histogram generating section 130 generates a measured histogram with a digital range narrower than the full scale range of the AD converter 10.

In this case, the ideal histogram generating section 160 may generate the ideal histogram using Expressions 8 and 9, where the number of divisions Nbin is equal to the number of bins in the digital range [a, b] of the measured histogram, and need not calculate the number of divisions Nbin based on the number of bits of the AD converter 10. Since the ideal histogram can be generated using the above method, the measurement apparatus 100 can evaluate the AD converter 10 by comparing the measured histogram and the ideal histogram. Similarly, if the signal supplying section 110 supplies a sine wave signal that exceeds the upper limit but does not go beyond the lower limit of the full scale of the AD converter 10, the range calculating section 140 can calculate the analog value using Expressions 5 and 7 in the same manner as described above.

In the measurement apparatus 100 according to the embodiment described above, the signal supplying section 110 supplies a sine wave signal that goes beyond at least one of the upper limit and the lower limit of the full scale of the AD converter 10. Instead, the signal supplying section 110 may supply a sine wave signal that exceeds neither the upper nor the lower limit of the full scale of the AD converter 10.

In this case, the range calculating section 140 sets the range for the ideal histogram of the input sine wave signal to be the range from −A to A shown in FIG. 4, in the same manner as the above embodiment. Since the input sine wave signal does not exceed the full scale range of the AD converter 10, the range calculating section 140 sets [a, b] as the digital range to be observed within the digital range converted by the AD converter, and calculates the analog values corresponding to the digital values "a" and b. The observed range [a, b] may be designated by the user or may be preset by the measurement apparatus 100.

The range calculating section 140 uses Expression 5 to calculate the analog value "a" corresponding to the digital value "a," and uses Expression 7 to calculate the analog value b corresponding to the digital value b. For example, when calculating the analog value "a," the further the position of the digital value "a" gets from −A, the wider the range from −A to "a," which is the integrated range in Expression 4, becomes. Therefore, the range calculating section 140 can more accurately calculate the analog values. The range calculating section 140 supplies the analog values "a" and b to the ideal histogram generating section 160.

The ideal histogram generating section 160 may calculate the ideal histogram using Expressions 8 and 9, with the number of divisions Nbin being the number of bins in the digital range [a, b] of the measured histogram. The measurement apparatus 100 can evaluate the AD converter 10 by comparing the generated ideal histogram and the measured histogram.

The histogram shown in FIG. 4 has high occurrence frequencies in the areas near the amplitude values of the sine wave signal indicated by −A and A, enabling the measurement apparatus 100 to identify the characteristics of the AD converter 10 with a high accuracy. In this way, the measurement apparatus 100 may adjust the output signal of the signal supplying section 110 such that the upper limit and/or lower limit of the sine wave signal within the full scale of the AD converter 10 are positioned in a range to be measured with especially high accuracy.

In the measurement apparatus 100 according to the embodiment described above, the ideal histogram generating section 160 calculates the width ΔBin of one bin by substituting the analog values "a" and b into Expression 8. Instead, the ideal histogram generating section 160 may calculate ΔBin using Expression 10 and the digital values "a" and b.

$$\Delta \text{Bin} = \frac{b-a}{Nbin-1} \quad \text{Expression 10}$$

In the measurement apparatus 100 according to the embodiment described above, the ideal histogram generating section 160 generates the ideal histogram using Expressions 8 and 9. Instead, the ideal histogram generating section 160 may generate the ideal histogram using Expressions 11 and 12

$$p(v) = \frac{1}{\pi} \cdot \frac{\partial}{\partial v} \sin^{-1}\left(\frac{v}{A}\right) \quad \text{Expression 11}$$

$$H[n] = \int_{n-\Delta Bin/2}^{n+\Delta Bin/2} p(v) dv \approx \frac{1}{\pi} \cdot \left\{ \sin^{-1}\left(\frac{v+\Delta Bin}{A}\right) - \sin^{-1}\left(\frac{v}{A}\right) \right\} \quad \text{Expression 12}$$

Expression 11 is a theoretical probability density function, and is used for conventional sine wave histogram methods. Accordingly, when using this method for the ideal histogram calculation method according to the present embodiment, the ideal histogram generating section 160 can obtain the ideal histogram by performing definite integration on Expression 11. Accordingly, the ideal histogram generating section 160 may calculate the ideal histogram using Expression 12. The calculation is complex, but when the ideal histogram generating section 160 uses the conventional calculation method to increase development efficiency or the like, it is desirable to be able to select a calculation method suitable for a desired objective.

In the measurement apparatus 100 according to the embodiment described above, the signal supplying section 110 supplies a sine wave signal, but the signal supplying section 110 may supply any signal that can be expressed mathematically and that can be integrated. The measurement apparatus 100 obtains the analog values of the ideal histogram corresponding to the upper and lower limit values of the measured histogram by integrating the mathematical expression of the supplied signal, and can therefore perform the histogram technique according to the present embodiment as long as the signal can be expressed mathematically and can be integrated.

The measurement apparatus 100 according to the embodiment described above calculates the ideal histogram based on the analog values corresponding to the upper and lower limit values of the digital range in which the measured histogram is generated. In this way, the measurement apparatus 100 can test the characteristics of the AD converter 10 using an ideal histogram that is based on the upper and lower limit values, and can therefore perform linearity error measurement using an end point method.

The linearity error of the end point method is defined by the Electronic Industries Association of Japan (EIAJ) as being the difference between the ideal output and the actual output of the AD converter 10 when the offset error and gain error are adjusted to be 0 at the upper and lower limit values of the digital range. If there is no error between the ideal values and the measured values of the AD converter 10 at the upper and lower limits of the full scale of the AD converter 10, then calculating the linearity error with a conventional histogram technique is equivalent to using the end point method. However, since conventional histogram techniques do not adjust the error to be zero at the upper and lower limit values of the digital range, these conventional techniques differ from the end point method when there is a difference between the measured value and the ideal value.

Accordingly, in order for a conventional histogram technique to achieve the same result as the end point method when calculating the linearity error, the measurement apparatus must individually measure the offset error and gain error at the upper and lower limits of the full scale of the AD converter 10, and convert these measurements. On the other hand, the measurement apparatus 100 of the present embodiment calculates the ideal histogram based on the frequencies at both ends of the measured histogram, and can therefore calculate the linearity error in the same manner as when using the end point method, regardless of position in the full scale of the AD converter 10 at which the linearity error occurs.

Figure 7:
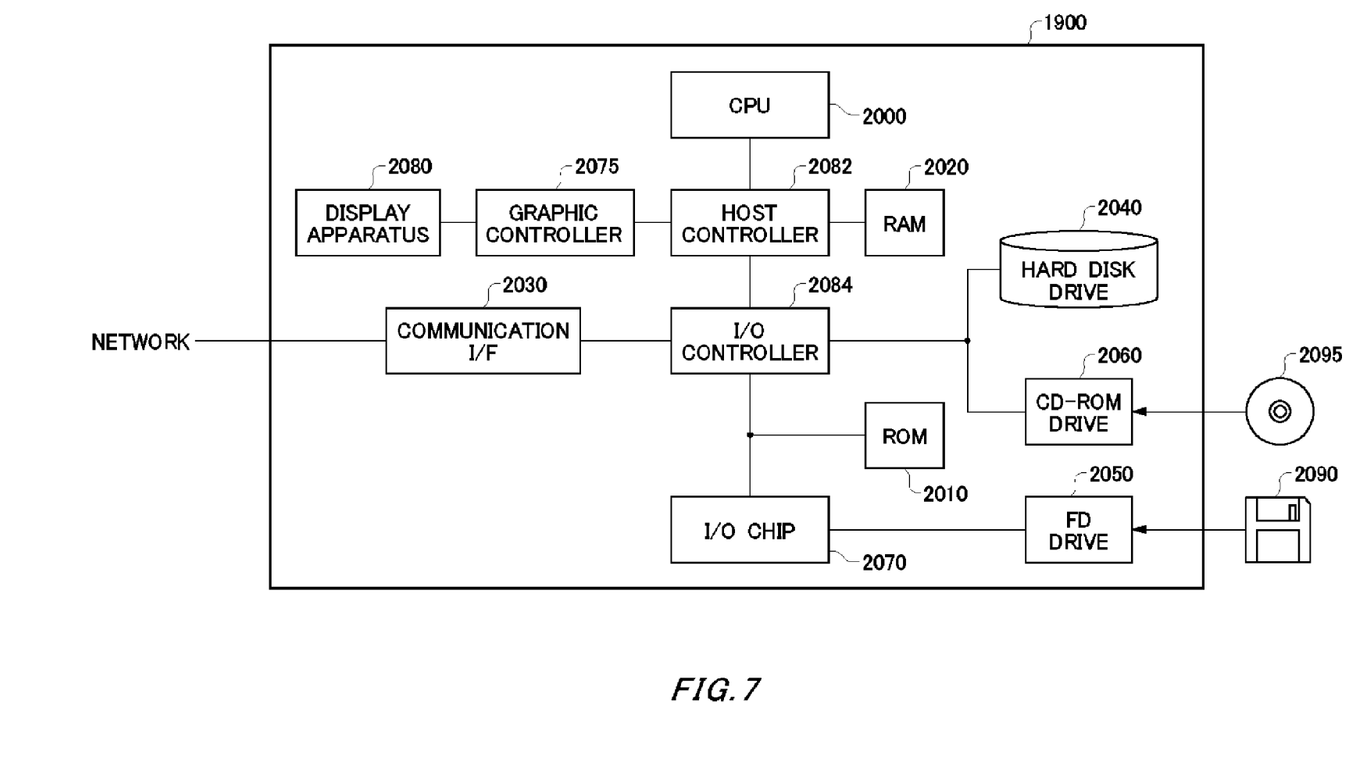
FIG. 7 shows an example of a hardware configuration of a computer 1900 according to the present embodiment.

FIG. 7 shows an example of a hardware configuration of a computer 1900 according to the present embodiment. The computer 1900 according to the present embodiment is provided with a CPU peripheral including a CPU 2000, a RAM 2020, a graphic controller 2075, and a display apparatus 2080, all of which are connected to each other by a host controller 2082; an input/output section including a communication interface 2030, a hard disk drive 2040, and a DVD drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, and the hard disk drive 2040, and the DVD drive 2060 to the host controller 2082. The communication interface 2030 communicates with other apparatuses via a network. The hard disk drive 2040 stores the programs and data used by the CPU 2000 housed in the computer 1900. The DVD drive 2060 reads the programs and data from a DVD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to the input/output controller 2084 along with each of the input/output apparatuses via, a parallel port, a serial port, a keyboard port, a mouse port, or the like.

The programs provided to the hard disk drive 2040 via the RAM 2020 are stored in a storage medium, such as the flexible disk 2090, the DVD-ROM 2095, or an IC card, and provided by a user. The programs are read from storage medium, installed in the hard disk drive 2040 inside the computer 1900 via the RAM 2020, and performed by the CPU 2000.

The programs installed in the computer 1900 to cause the computer 1900 to calculate a characteristic of the AD converter of the measurement apparatus 100 are provided with a measured histogram generating module, a range calculating module, an identifying module, an ideal histogram generating module, and an error identifying module. These programs and modules prompt the CPU 2000 or the like to make the computer 1900 function as the measured histogram generating section 130, the range calculating section 140, the identifying section 150, the ideal histogram generating section 160, and the error identifying section 170, respectively.

The information processes recorded in these programs are read by the computer 1900 to cause the computer 1900 to function as software and hardware described above, which are exemplified by the specific sections of the measured histogram generating section 130, the range calculating section 140, the identifying section 150, the ideal histogram generating section 160, and the error identifying section 170. With these specific sections, a unique function for calculating a characteristic of the AD converter in the measurement apparatus 100 suitable for an intended use can be configured by realizing the calculations or computations appropriate for the intended use of the computer 1900 of the present embodiment.

For example, if there is communication between the computer 1900 and an external apparatus or the like, the CPU 2000 performs the communication program loaded in the RAM 2020, and provides the communication interface 2030 with communication processing instructions based on the content of the process recorded in the communication program. The communication interface 2030 is controlled by the CPU 2000 to read the transmission data stored in the transmission buffer area or the like on the storage apparatus, such as the RAM 2020, the hard disc 2040, the flexible disk 2090, or the DVD-ROM 2095, and send this transmission data to the network, and to write data received from the network onto a reception buffer area on the storage apparatus. In this way, the communication interface 2030 may transmit data to and from the storage apparatus through DMA (Direct Memory Access). As another possibility, the CPU 2000 may transmit the data by reading the data from the storage apparatus or communication interface 2030 that are the origins of the transmitted data, and writing the data onto the communication interface 2030 or the storage apparatus that are the transmission destinations.

The CPU 2000 may perform various processes on the data in the RAM 2020 by reading into the RAM 2020, through DMA transmission or the like, all or a necessary portion of the database or files stored in the external apparatus such as the hard disk 2040, the DVD drive 2060, the DVD-ROM 2095, the flexible disk drive 2050, or the flexible disk 2090. The CPU 2000 writes the processed data back to the external apparatus through DMA transmission or the like. In this process, the RAM 2020 is considered to be a section that temporarily stores the content of the external storage apparatus, and therefore the RAM 2020, the external apparatus, and the like in the present embodiment are referred to as a memory, a storage section, and a storage apparatus. The variety of information in the present embodiment, such as the variety of programs, data, tables, databases, and the like are stored on the storage apparatus to become the target of the information processing. The CPU 2000 can hold a portion of the RAM 2020 in a cache memory and read from or write to the cache memory. With such a configuration as well, the cache memory serves part of the function of the RAM 2020, and therefore the cache memory is also included with the RAM 2020, the memory, and/or the storage apparatus in the present invention, except when a distinction is made.

The CPU 2000 executes the various processes such as the computation, information processing, condition judgment, searching for/replacing information, and the like included in the present embodiment for the data read from the RAM 2020, as designated by the command sequence of the program, and writes the result back onto the RAM 2020. For example, when performing condition judgment, the CPU 2000 judges whether a variable of any type shown in the present embodiment fulfills a condition of being greater than, less than, no greater than, no less than, or equal to another variable or constant. If the condition is fulfilled, or unfulfilled, depending on the circumstances, the CPU 2000 branches into a different command sequence or acquires a subroutine.

The CPU 2000 can search for information stored in a file in the storage apparatus, the database, and the like. For example, if a plurality of entries associated respectively with a first type of value and a second type of value are stored in the storage apparatus, the CPU 2000 can search for entries fulfilling a condition designated by the first type of value from among the plurality of entries stored in the storage apparatus. The CPU 2000 can then obtain the second type of value associated with the first type of value fulfilling the prescribed condition by reading the second type of value stored at the same entry.

The programs and modules shown above may also be stored in an external storage medium. The flexible disk 2090, the DVD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A measurement apparatus that measures a characteristic of an AD converter, comprising:
    a signal supplying section that supplies the AD converter with an analog input signal having a prescribed waveform;
    an acquiring section that acquires a digital output signal output by the AD converter as a result of sampling the analog input signal;
    a measured histogram generating section that generates a measured histogram of the digital output signal, the measured histogram defining a plurality of frequencies of occurrence corresponding to digital values of the digital output signal; and
    a range calculating section that calculates at least one of an analog value corresponding to a lower limit and an analog value corresponding to an upper limit of a prescribed digital range, based on at least one of (i) a frequency of occurrence, from among the plurality of frequencies of occurrence, corresponding to digital values of the digital output signal that are less than or equal to the digital range and (ii) a frequency of occurrence, from among the plurality of frequencies of occurrence, corresponding to digital values of the digital output signal that are greater than or equal to the digital range.

2. The measurement apparatus according to claim 1, further comprising
    an identifying section that identifies an error of the AD converter based on the measured histogram and the at least one of the analog value corresponding to the lower limit and the analog value corresponding to the upper limit of the digital range calculated by the calculating section.

3. The measurement apparatus according to claim 2, wherein
    the identifying section includes:
        an ideal histogram generating section that generates an ideal histogram, which is a histogram obtained by sampling the analog input signal having the prescribed waveform, based on the at least one of the analog value corresponding to the lower limit and the analog value corresponding to the upper limit of the digital range calculated by the calculating section; and
        an error identifying section that identifies the error of the AD converter based on the measured histogram and the ideal histogram.

4. The measurement apparatus according to claim 1, wherein
    the range calculating section calculates a lower limit analog value corresponding to the lower limit of the digital range and an upper limit analog value corresponding to the upper limit of the digital range, based on (i) the frequency of occurrence corresponding to the digital values that are less than or equal to the digital range and (ii) the frequency of occurrence corresponding to the digital values that are greater than or equal to the digital range.

5. The measurement apparatus according to claim 1, wherein
    the signal supplying section supplies the AD converter with the analog input signal having an amplitude larger than a measurement range of the AD converter, and
    the range calculating section calculates a lower limit analog value corresponding to the lower limit of the digital range and an upper limit analog value corresponding to the upper limit of the digital range, based on (i) a frequency of occurrence, from among the plurality of frequencies of occurrence, corresponding to digital values of the digital output signal that are less than or equal to the measurement range and (ii) a frequency of occurrence, from among the plurality of frequencies of occurrence, corresponding to digital values of the digital output signal that are greater than or equal to the measurement range.

6. The measurement apparatus according to claim 5, wherein
    the range calculating section calculates, as the lower limit analog value, a value at which (i) an integrated value obtained by integrating the analog input signal over a range of values less than or equal to the lower limit analog value is equal to (ii) a frequency of occurrence, from among the plurality of frequencies of occurrence, corresponding to the lower limit of the digital range, and
    the range calculating section calculates, as the upper limit analog value, a value at which (i) an integrated value obtained by integrating the analog input signal over a range of values greater than or equal to the upper limit analog value is equal to (ii) a frequency of occurrence, from among the plurality of frequencies of occurrence, corresponding to the upper limit of the digital range.

7. The measurement apparatus according to claim 5, wherein
    the signal supplying section supplies the analog input signal to have a sine waveform.

8. The measurement apparatus according to claim 7, wherein
    the range calculating section calculates the lower limit analog value "a" based on the frequency of occurrence fl corresponding to the lower limit of the digital range, using an expression a=sin $\{\pi(fl-\frac{1}{2})\}$; and
    the range calculating section calculates the upper limit analog value "b" based on the frequency of occurrence fu corresponding to the upper limit of the digital range, using an expression b=sin $\{\pi(\frac{1}{2}-fu)\}$.

9. The measurement apparatus according to claim 8, further comprising
    an ideal histogram generating section that calculates an ideal histogram, which is a histogram obtained by sampling the analog input signal having the prescribed digital range, based on the lower limit analog value "a" and the upper limit analog value "b," using an expression $$H[n] = \int_{n-\Delta Bin/2}^{n+\Delta Bin/2} \frac{1}{\pi\sqrt{1-v^2}} dv \approx p(n) \cdot \Delta Bin.$$

10. A computer program product, having computer instructions, recorded on a non-transitory computer readable medium, for enabling a computer executing the computer instructions to calculate a characteristic of an AD converter, the computer instructions causing the computer to function as a measurement apparatus comprising:
    a measured histogram generating section that generates a measured histogram of a digital output signal output by the AD converter as a result of the AD converter being caused to sample an analog input signal having a prescribed waveform, the measured histogram defining a plurality of frequencies of occurrence corresponding to digital values of the digital output signal; and
    a range calculating section that calculates at least one of an analog value corresponding to a lower limit and an analog value corresponding to an upper limit of a prescribed digital range, based on at least one of (i) a frequency of occurrence, from among the plurality of frequencies of occurrence, corresponding to digital values of the digital output signal that are less than or equal to the digital range and (ii) a frequency of occurrence, from among the plurality of frequencies of occurrence, corresponding to digital values of the digital output signal that are greater than or equal to the digital range.

11. The non-transitory computer readable medium on which the computer program product according to claim 10 is recorded.

12. A method for measuring a characteristic of an AD converter, comprising:
    supplying the AD converter with an analog input signal having a prescribed waveform;
    acquiring a digital output signal output by the AD converter as a result of sampling the analog input signal;
    generating a measured histogram of the digital output signal, the measured histogram defining a plurality of frequencies of occurrence corresponding to digital values of the digital output signal; and
    calculating at least one of an analog value corresponding to a lower limit and an analog value corresponding to an upper limit of a prescribed digital range, based on at least one of (i) a frequency of occurrence, from among the plurality of frequencies of occurrence, corresponding to digital values of the digital output signal that are less than or equal to the digital range and (ii) a frequency of occurrence, from among the plurality of frequencies of occurrence, corresponding to digital values of the digital output signal that are greater than or equal to the digital range.

13. The non-transitory computer readable medium according to claim 11, wherein the computer instructions cause the computer to function as a measurement apparatus further comprising:
    an identifying section that identifies an error of the AD converter based on the measured histogram and the at least one of the analog value corresponding to the lower limit and the analog value corresponding to the upper limit of the digital range calculated by the calculating section.

14. The non-transitory computer readable medium according to claim 11, wherein
    the signal supplying section supplies the AD converter with the analog input signal having an amplitude larger than a measurement range of the AD converter, and
    the range calculating section calculates a lower limit analog value corresponding to the lower limit of the digital range and an upper limit analog value corresponding to the upper limit of the digital range, based on (i) a frequency of occurrence, from among the plurality of frequencies of occurrence, corresponding to digital values of the digital output signal that are less than or equal to the measurement range and (ii) a frequency of occurrence, from among the plurality of frequencies of occurrence, corresponding to digital values of the digital output signal that are greater than or equal to the measurement range.

15. The non-transitory computer readable medium according to claim 14, wherein
    the signal supplying section supplies the analog input signal to have a sine waveform.

16. The non-transitory computer readable medium according to claim 15, wherein
    the range calculating section calculates the lower limit analog value "a" based on the frequency of occurrence fl corresponding to the lower limit of the digital range, using an expression $a = \sin\{\pi(fl - \frac{1}{2})\}$; and
    the range calculating section calculates the upper limit analog value "b" based on the frequency of occurrence fu corresponding to the upper limit of the digital range, using an expression $b = \sin\{\pi(\frac{1}{2} - fu)\}$.

17. The method according to claim 12, further comprising identifying an error of the AD converter based on the measured histogram and the at least one of the analog value corresponding to the lower limit and the analog value corresponding to the upper limit of the digital range calculated by the calculating section.

18. The method according to claim 12, wherein
    the analog input signal has an amplitude larger than a measurement range of the AD converter, and
    the calculating step includes calculating a lower limit analog value corresponding to the lower limit of the digital range and an upper limit analog value corresponding to the upper limit of the digital range, based on (i) a frequency of occurrence, from among the plurality of frequencies of occurrence, corresponding to digital values of the digital output signal that are less than or equal to the measurement range and (ii) a frequency of occurrence, from among the plurality of frequencies of occurrence, corresponding to digital values of the digital output signal that are greater than or equal to the measurement range.

19. The method according to claim 18, wherein the analog input signal has a sine waveform.

20. The measurement apparatus according to claim 19, wherein
    the calculating includes:
        calculating the lower limit analog value "a" based on the frequency of occurrence fl corresponding to the lower limit of the digital range, using an expression $a = \sin\{\pi(fl - \frac{1}{2})\}$; and
        calculating the upper limit analog value "b" based on the frequency of occurrence fu corresponding to the upper limit of the digital range, using an expression $b = \sin\{\pi(\frac{1}{2} - fu)\}$.

* * * * *